US 6,559,546 B1

(12) United States Patent
Achuthan et al.

(10) Patent No.: US 6,559,546 B1
(45) Date of Patent: May 6, 2003

(54) TIN PALLADIUM ACTIVATION WITH MAXIMIZED NUCLEI DENSITY AND UNIFORMITY ON BARRIER MATERIAL IN INTERCONNECT STRUCTURE

(75) Inventors: Krishnashree Achuthan, San Ramon, CA (US); Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/228,010

(22) Filed: Aug. 26, 2002

Related U.S. Application Data

(62) Division of application No. 10/118,511, filed on Apr. 8, 2002, now Pat. No. 6,472,310.

(51) Int. Cl.[7] .......................... H01L 23/48; H01L 23/52; H01L 29/40
(52) U.S. Cl. .......................... 257/758; 257/762; 257/774
(58) Field of Search ................................. 257/758, 762, 257/774

(56) References Cited

U.S. PATENT DOCUMENTS 6,261,637 B1 * 7/2001 Oberle .......................... 427/304
6,399,496 B1 * 6/2002 Edelstein et al. ............ 438/687
6,472,310 B1 * 10/2002 Achuthan et al. ............ 438/627

* cited by examiner

Primary Examiner—David Helms
Assistant Examiner—Tu-Tu Ho
(74) Attorney, Agent, or Firm—Monica H. Choi

(57) ABSTRACT

For fabricating an interconnect structure formed within an interconnect opening surrounded by dielectric material, a layer of diffusion barrier material is formed on at least one wall of the interconnect opening. An activation layer comprised of palladium is formed on the layer of diffusion barrier material when the interconnect opening is immersed in an activation bath comprised of tin ions and palladium ions. The tin ions have a tin ion concentration in the activation bath that is greater than a palladium ion concentration in the activation bath. A layer of seed material is deposited on the activation layer in an electroless deposition process, and the interconnect opening is filled with a conductive fill material grown from the layer of seed material. A layer of silicon rich material may be formed on the layer of diffusion barrier material before deposition of the activation layer such that the activation layer is formed on the layer of silicon rich material. In that case, a ratio of the tin ion concentration to the palladium ion concentration in the activation bath is adjusted to decrease with an amount of silicon atoms of the layer of silicon rich material deposited on the layer of diffusion barrier material. The present invention may be practiced to particular advantage when the layer of seed material and the conductive fill material are comprised of copper.

19 Claims, 6 Drawing Sheets

TIN PALLADIUM ACTIVATION WITH MAXIMIZED NUCLEI DENSITY AND UNIFORMITY ON BARRIER MATERIAL IN INTERCONNECT STRUCTURE

This is a divisional of an earlier filed patent application, with Ser. No. 10/118,511 filed on Apr. 8, 2002, now U.S. Pat. No. 6,472,310, for which priority is claimed. This earlier filed patent application with Ser. No. 10/118,511 is in its entirety incorporated herewith by reference.

TECHNICAL FIELD

The present invention relates generally to fabrication of interconnect structures within integrated circuits, and more particularly, to a mechanism for maximizing the nuclei density and uniformity of a palladium surface activation layer formed on a barrier material for minimizing electromigration failure of the interconnect structure.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a bottom dielectric material 109 deposited on a semiconductor wafer 108 such as a silicon substrate as part of an integrated circuit. The bottom dielectric material 109 may be a hardmask layer, an etch stop layer, or a capping layer comprised of $SiO_2$ (silicon dioxide) or SiN (silicon nitride) for example. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

In addition, for forming the copper interconnect, an activation layer 111 is deposited onto the diffusion barrier material 110, and a copper seed layer 103 is deposited onto the activation layer 111. The copper conductive fill 102 is electroplated from the copper seed layer 103 in a copper electroplating deposition process. Processes for forming the diffusion barrier material 110, the activation layer 111, the copper seed layer 103, and the copper conductive fill 102 are known to one of ordinary skill in the art of integrated circuit fabrication.

As the width of the copper interconnect is scaled down to tens of nanometers, a conformal deposition process is used for depositing the diffusion barrier material 110 on the sidewalls and the bottom wall of the interconnect opening. However, the copper seed layer 103 may not readily form on the conformal diffusion barrier material 110 in the typical electroless deposition process for forming the copper seed layer 103. Thus, the activation layer 111 is first deposited on the diffusion barrier material 110, and the activation layer 111 is comprised of a material such as palladium or a tin palladium colloid that promotes deposition of the copper seed layer 103 thereon during the electroless deposition process for the copper seed layer 103. For example, U.S. Pat. No. 6,197,688 to Simpson describes a process for forming the activation layer 111 comprised of a tin and palladium colloid, and U.S. Pat. No. 6,291,082 to Lopatin describes a process for forming the activation layer 111 comprised of palladium.

As the line width of the interconnect structure is continually decreased, the thickness of the diffusion barrier material 110 and the thickness of the activation layer 111 are desired to be minimized to in turn minimize the volume of the diffusion barrier material 110 and the volume of the activation layer 111 within the interconnect opening. Minimizing the volume of the diffusion barrier material 110 and the activation layer 111 in turn maximizes the volume of the copper conductive fill material 102. Generally, diffusion barrier materials and materials of the activation layer 111 have higher resistance than the copper conductive fill material, as known to one of ordinary skill in the art of integrated circuit fabrication. Thus, maximizing the volume of the copper conductive fill material 102 and minimizing the volume of the diffusion barrier material 110 and the activation layer 111 advantageously results in minimizing the resistance of the interconnect structure.

For minimizing the thickness of the diffusion barrier material 110, a conformal deposition process such as a CVD (chemical vapor deposition) process is used for deposition of the diffusion barrier material 110. Referring to FIG. 2, the activation layer 111 that is relatively thin, such as in a range of tens of angstroms for example, is deposited using an activation solution comprised of palladium ions that are reduced, as known to one of ordinary skill in the art of integrated circuit fabrication. The activation layer 111 for example may be comprised of palladium in that case. However, with such a relatively thin activation layer 111, the palladium ions within the activation solution may cause the deposited palladium of the activation layer 111 to agglomerate into clusters 112 within the interconnect opening 104.

Referring to FIGS. 2 and 3, when the copper seed layer 103 is formed from such uneven deposition of the agglomerated palladium activation layer 112, the step coverage of the copper seed layer 103 is also uneven within the interconnect opening 104. In that case, the palladium activation layer 111 and the copper seed layer 103 do not cover some portions of the sidewalls and the bottom wall of the interconnect opening. Referring to FIGS. 3 and 4, when the copper conductive fill 102 is electroplated from the uneven copper seed layer 103, voids 122 may be formed from portions of the sidewalls and the bottom wall of the interconnect opening that are not covered with the copper seed layer 103.

Such voids 122 are particularly disadvantageous for causing electromigration failure within interconnects having scaled down dimensions of tens of nanometers. Nevertheless, the thickness of the activation layer 111 is desired to be scaled down for minimizing resistance of the copper interconnect. However, the prior art, including U.S. Pat. No. 6,197,688 to Simpson and U.S. Pat. No. 6,291,082 to Lopatin do not address prevention of agglomeration of the activation layer 111 as the thickness of the activation layer 111 is further scaled down. Thus, a mechanism is desired for preventing agglomeration of the activation layer 111 as the thickness of the activation layer 111 is further scaled down to eliminate voids for minimizing electromigration failure of the copper interconnect.

SUMMARY OF THE INVENTION

Accordingly, in a general aspect of the present invention, the concentration of the Sn (tin) ions in relation to the concentration of the Pd (palladium) ions is increased in the activation bath for preventing agglomeration of the palladium activation layer formed on the diffusion barrier material within an interconnect opening.

In a general aspect of the present invention, in a system and method for fabricating an interconnect structure formed within an interconnect opening surrounded by dielectric material, a layer of diffusion barrier material is formed on at least one wall of the interconnect opening. An activation layer comprised of palladium is formed on the layer of diffusion barrier material when the interconnect opening is immersed in an activation bath comprised of tin ions and palladium ions. The tin ions have a tin ion concentration in the activation bath that is greater than a palladium ion concentration in the activation bath. A layer of seed material is deposited on the activation layer in an electroless deposition process, and the interconnect opening is filled with a conductive fill material grown from the layer of seed material.

In another embodiment of the present invention, a layer of silicon rich material is formed on the layer of diffusion barrier material before deposition of the activation layer such that the activation layer is formed on the layer of silicon rich material. In that case, a ratio of the tin ion concentration to the palladium ion concentration in the activation bath is adjusted to decrease with an amount of silicon atoms of the layer of silicon rich material deposited on the layer of diffusion barrier material. For example, when the layer of silicon rich material is not deposited on the layer of diffusion barrier material, the ratio of the tin ion concentration to the palladium ion concentration in the activation bath is 5:1. On the other hand, when the layer of silicon rich material is deposited on the layer of diffusion barrier material, the ratio of the tin ion concentration to the palladium ion concentration in the activation bath is one of 3:1 or 5:2. Alternatively, when the layer of silicon rich material that is comprised of substantially only silicon atoms is deposited on the layer of diffusion barrier material, the ratio of the tin ion concentration to the palladium ion concentration in the activation bath is 2:1.

In an example embodiment of the present invention, the layer of seed material and the conductive fill material are comprised of copper, and the layer of diffusion barrier material is comprised of titanium silicon nitride (TiSiN). The present invention may be advantageously used when the interconnect opening is one of a metal line, a via hole, or a dual damascene opening.

In this manner, the activation layer of palladium is formed with higher nuclei density and uniformity to prevent agglomeration of the activation layer as the thickness of the activation layer is scaled down to tens of angstroms. Such a uniform activation layer in turn results in uniform deposition of the copper seed layer which prevents formation of voids within the copper interconnect for minimizing electromigration failure of the copper interconnect. In addition, the thinner activation layer advantageously results in minimized resistance of the copper interconnect.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, and 15 refer to elements having similar structure and function.

DETAILED DESCRIPTION

The present invention is described for formation of copper interconnect. However, the present invention may be practiced for minimizing resistance for conductive fill of other types of interconnects, as would be apparent to one of ordinary skill in the art of integrated circuit fabrication from the description herein.

Figure 1:
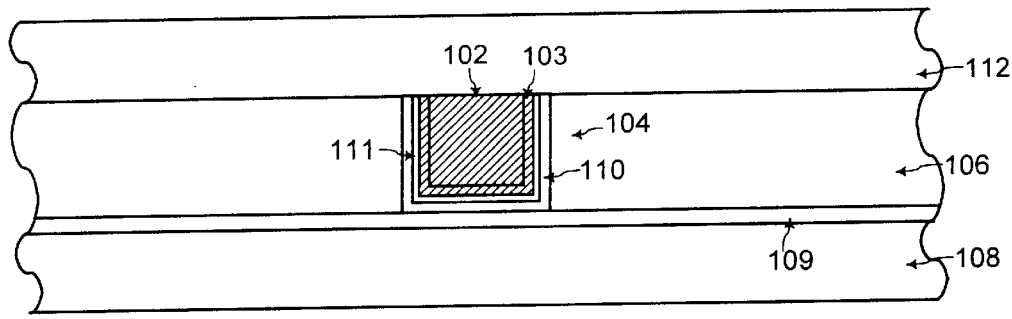
FIG. 1 shows a cross-sectional view of a copper interconnect formed by copper filling a trench within an insulating layer, according to the prior art.
Figure 2:
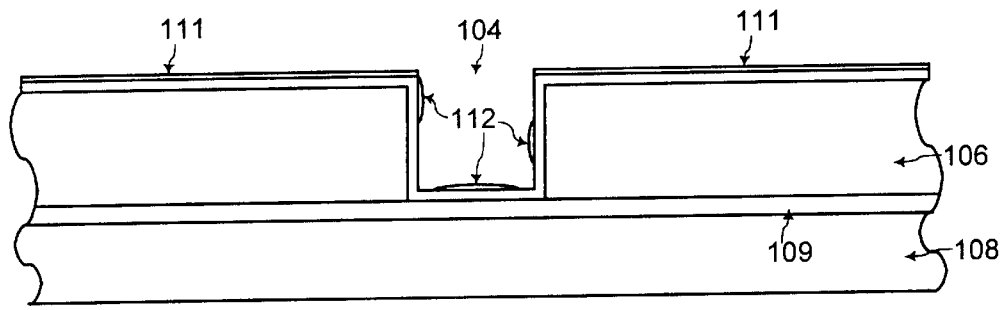
FIG. 2 shows a cross-sectional view illustrating deposition of a thin activation layer comprised of palladium with agglomeration of the palladium, according to the prior art.
Figure 3:
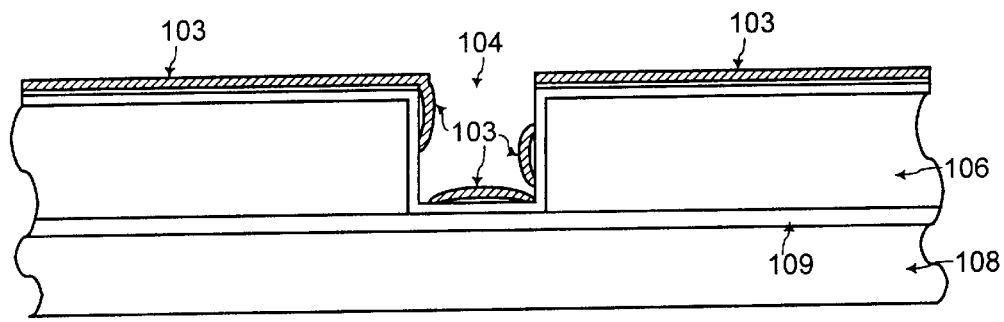
FIG. 3 shows a cross-sectional view illustrating uneven deposition of the copper seed layer onto the agglomerated palladium activation layer of FIG. 2, according to the prior art.
Figure 4:
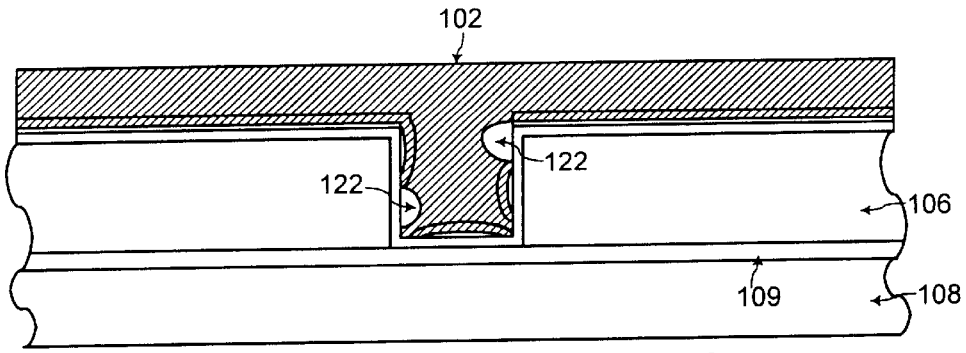
FIG. 4 shows a cross-sectional view illustrating electroplating of the copper conductive fill from the uneven copper seed layer of FIG. 3 with formation of voids, according to the prior art.
Figure 6:
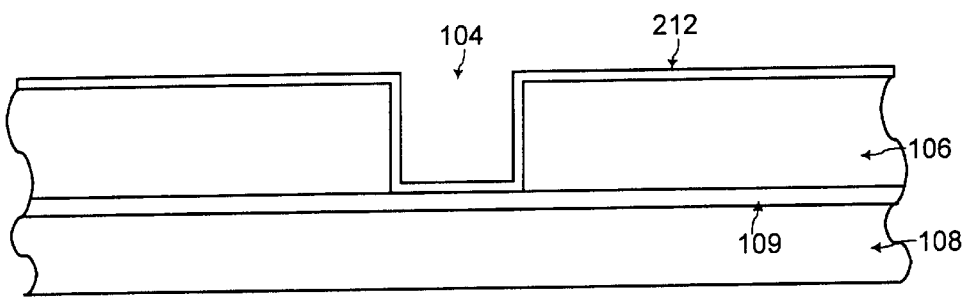
FIGS. 6, 7, 8, 9, and 10 show cross-sectional views of the interconnect structure formed with the system of FIG. 5 for a thin palladium activation layer having high nuclei density and uniformity, according to an embodiment of the present invention.
Figure 5:
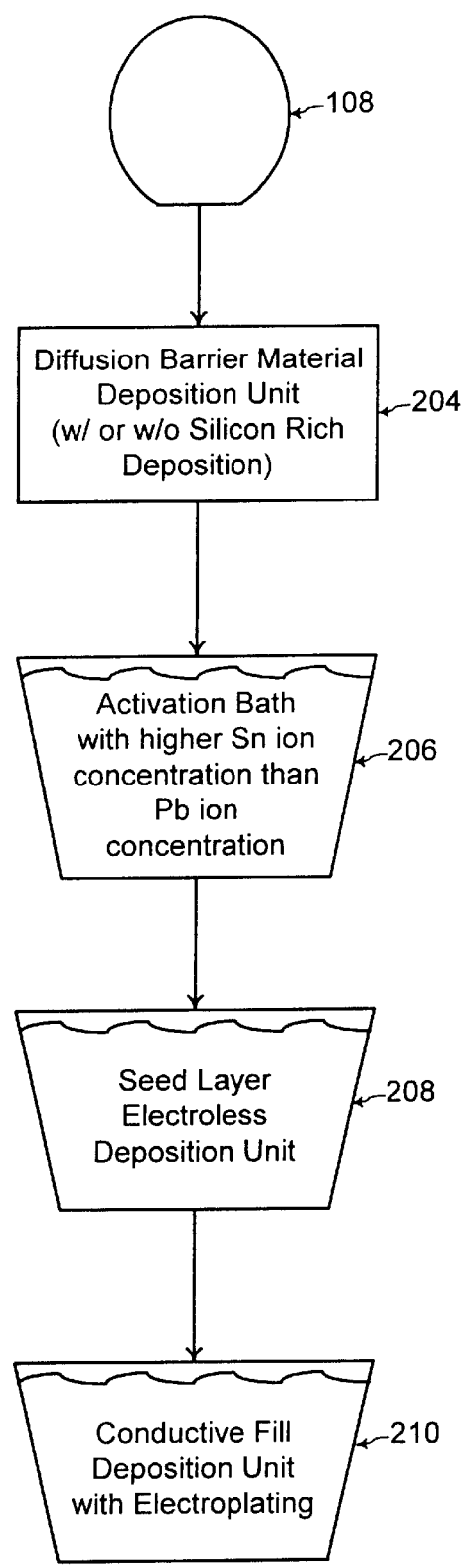
FIG. 5 shows a system flow diagram for formation of the interconnect structure with a thin palladium activation layer having high nuclei density and uniformity, according to an embodiment of the present invention.

FIG. 5 illustrates a system flow chart for forming the thin palladium activation layer having high nuclei density and uniformity according to a general aspect of the present invention. The semiconductor wafer 108 having the interconnect structure to be formed thereon is first placed within a diffusion barrier material deposition unit 204. Referring to FIGS. 5 and 6, the semiconductor wafer 108 has an interconnect opening 104 that is formed within the insulating layer 106 comprised of dielectric material that may be comprised of silicon dioxide ($SiO_2$) or a low dielectric constant insulating material such as organic doped silica, for example.

In addition, the interconnect opening 104 is formed on a layer of bottom dielectric material 109 deposited on the semiconductor wafer 108. The bottom dielectric material 109 may be a hardmask layer, an etch stop layer, or a capping layer comprised of $SiO_2$ (silicon dioxide) or SiN (silicon nitride) for example. Processes for patterning and etching such an insulating layer 106 for forming the interconnect opening 104 are known to one of ordinary skill in the art of integrated circuit fabrication.

Further referring to FIGS. 5 and 6, when the semiconductor wafer 108 having the interconnect opening 104 is placed within the diffusion barrier material deposition unit 204, a layer of diffusion barrier material 212 is deposited onto the sidewalls and the bottom wall of the interconnect opening 104. The layer of diffusion barrier material 212 is comprised of a diffusion barrier material for preventing diffusion of the copper to be filled within the interconnect opening 104 into the surrounding insulating layer 106 and the bottom dielectric material 109. In one embodiment of the present invention, the diffusion barrier material is comprised of TiSiN (titanium silicon nitride). Such diffusion barrier materials are known to one of ordinary skill in the art of integrated circuit fabrication. In addition, the diffusion barrier material deposition unit 204 using deposition processes such as the conformal CVD (chemical vapor deposition) process for example for deposition of the diffusion barrier material 212, is known to one of ordinary skill in the art of integrated circuit fabrication.

Figure 7:
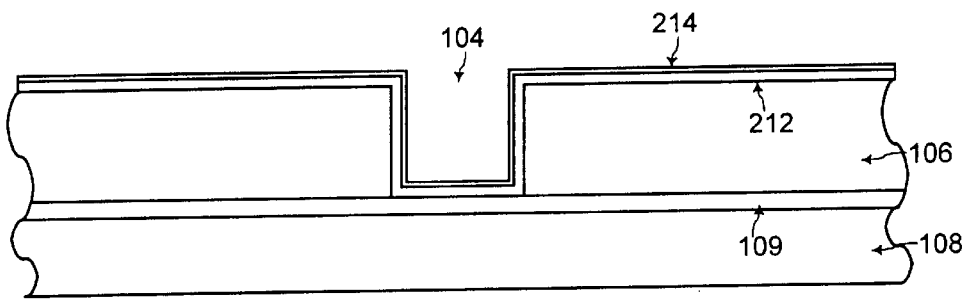

Referring to FIGS. 5 and 7, after formation of the layer of diffusion barrier material 212, the semiconductor wafer 108 is then immersed within an activation bath 206 for forming an activation layer 214 on the layer of diffusion barrier material 212. The activation bath contains tin (Sn) ions and palladium (Pd) ions for forming the activation layer 214 comprised of palladium according to an aspect of the present invention. The tin ions are used to reduce the palladium ions within the activation bath to form the activation layer 214, and such general activation baths are known to one of ordinary skill in the art of integrated circuit fabrication.

However, according to an aspect of the present invention, the number of tin ions (i.e., the tin ion concentration) within the activation bath 206 is significantly greater than the number of palladium ions (i.e., the palladium ion concentration) within the activation bath 206. For example, in one embodiment of the present invention, the ratio of the tin ion concentration to the palladium ion concentration within the activation bath 206 is 5:1. In that case, for every one palladium ion, there are five tin ions, within the activation bath 206.

With such a higher tin ion concentration, a majority of the palladium ions are reduced to form the activation layer 214 of palladium. With a substantial portion of the charged palladium ions being consumed, charged palladium ions are not available to cause agglomeration of the palladium of the activation layer 214. Thus, with reduced potential for agglomeration, the activation layer 214 of palladium has higher nuclei density and uniformity.

An example of the composition of the activation bath 206 is as follows:

Pd (palladium) ion source with a concentration within the activation bath being in a range of from about 0.01 to 10 milliliter/liter;

Sn (tin) ion source with a concentration within the activation bath being in a range of from about 0.1 to 25 grams/liter;

HCl (hydrochloric acid);

$H_2O$ (water);

PdCl (palladium chloride) as a palladium ion concentration adjuster;

SnCl (tin chloride) as a tin ion concentration adjuster; and pH of about 1 to 3.

Within such a range, in an aspect of the present invention, the tin ion concentration is adjusted to be substantially greater than the palladium ion concentration, such as in a ratio of 5:1 for example, for preventing agglomeration of the palladium of the activation layer 214. The thickness of the activation layer 214 of palladium may be controlled by the time of immersion within the activation bath 206 and with concentration of the tin and palladium ions within the activation bath 206.

Figure 8:
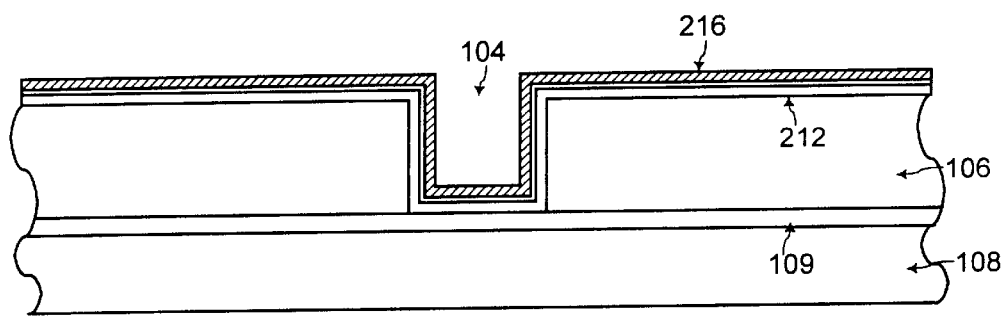

Referring to FIGS. 5 and 8, after formation of the activation layer 214, the semiconductor wafer 108 is then placed within a seed layer deposition unit 208 for forming a copper seed layer 216 on the activation layer 214. The seed layer deposition unit 208 for example is comprised of a copper electroless deposition solution having the following example composition:

Cu source in the form of a salt;

EDTA (Ethylenediamine tetra acetic acid) as a complexing agent;

Glyoxylic acid as a reducing agent;

$H_2O$ (water); and pH of about 9 to 12.5.

Such an electroless deposition solution for forming the copper seed layer 216 on the activation layer 214 of palladium is known to one of ordinary skill in the art of integrated circuit fabrication.

Figure 9:
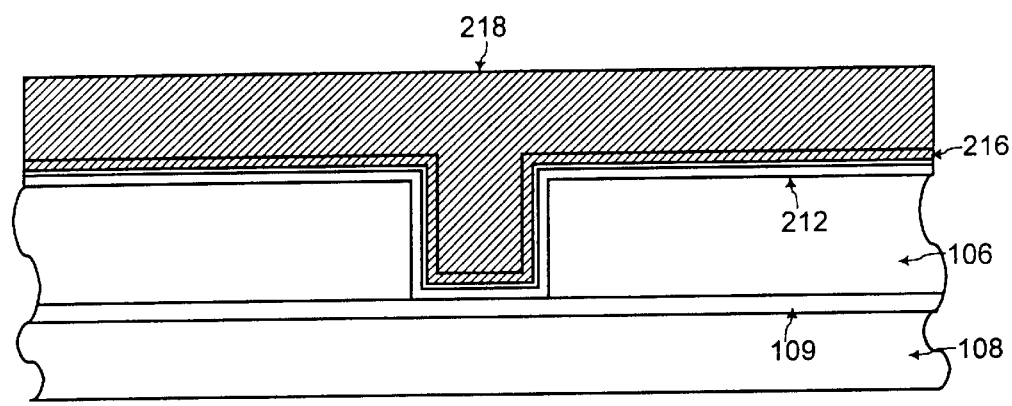

Referring to FIGS. 5 and 9, after formation of the layer of seed material 216 comprised of copper for example, the semiconductor wafer 108 is then placed within a conductive fill deposition unit 210 for filling the interconnect opening 104 with copper conductive fill 218 grown from the copper seed layer 216. The conductive fill deposition unit 210 for example is for an electroplating deposition process for electroplating the copper conductive fill 218 from the copper seed layer 216 as known to one of ordinary skill in the art of integrated circuit fabrication.

Figure 10:
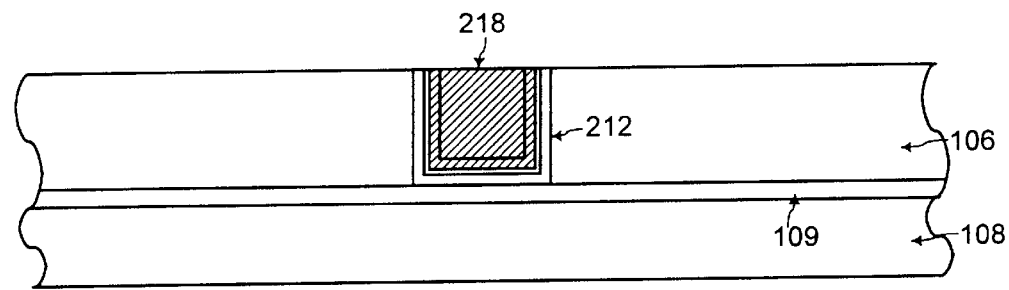

Referring to FIG. 10, the copper conductive fill 218, the copper seed layer 216, the activation layer of palladium 214, and the diffusion barrier material 212 are polished down and away from the insulating layer 106 surrounding the interconnect opening 104 in a CMP (chemical mechanical polishing) process. Thus, the copper conductive fill 218, the copper seed layer 216, the activation layer of palladium 214, and the diffusion barrier material 212 are contained within the interconnect opening 104 to form the interconnect structure. CMP (chemical mechanical polishing) processes are known to one of ordinary skill in the art of integrated circuit fabrication.

Figure 11:
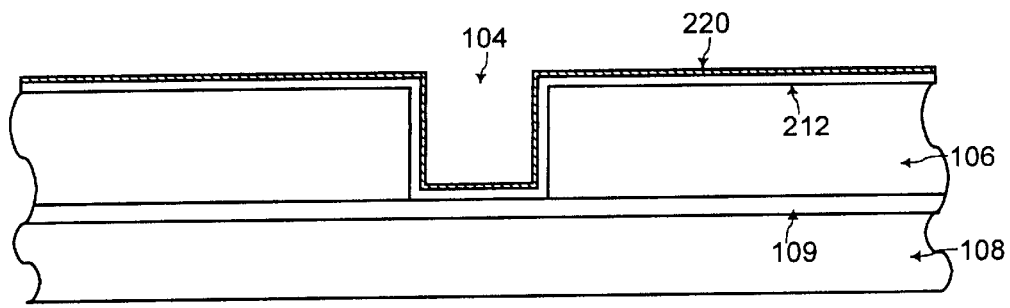
FIGS. 11, 12, and 13 shows cross-sectional views of the interconnect structure formed with the system of FIG. 5 with an additional silicon-rich layer for further increasing the nuclei density and uniformity of the thin palladium activation layer, according to a further embodiment of the present invention.

Referring to FIGS. 6 and 11, in another embodiment of the present invention, after deposition of the diffusion barrier material 212, a layer of silicon rich material 220 is formed on the exposed surfaces of the diffusion barrier material 212, before deposition of the activation layer of palladium. Referring to FIGS. 5 and 11, in one example, when the diffusion barrier material 212 is comprised of silicon such as titanium silicon nitride (TiSiN) for example, after formation of the diffusion barrier material 212 in the CVD diffusion barrier material deposition unit 204, the titanium source and the nitrogen source are turned off such that only the silicon source remains turned on to form the layer of silicon rich material 220 within the CVD diffusion barrier material deposition unit 204. In that case, the layer of silicon rich material 220 may be comprised of substantially only silicon atoms.

Alternatively, after formation of the diffusion barrier material 212 in the CVD diffusion barrier material deposition unit 204, the amount of the titanium and the nitrogen may be significantly reduced such that the layer of silicon rich material 220 is comprised of a majority of silicon atoms. However, the present invention may be practiced with other mechanisms as known to one of ordinary skill in the art of integrated circuit fabrication for forming the layer of silicon rich material 220.

Figure 12:
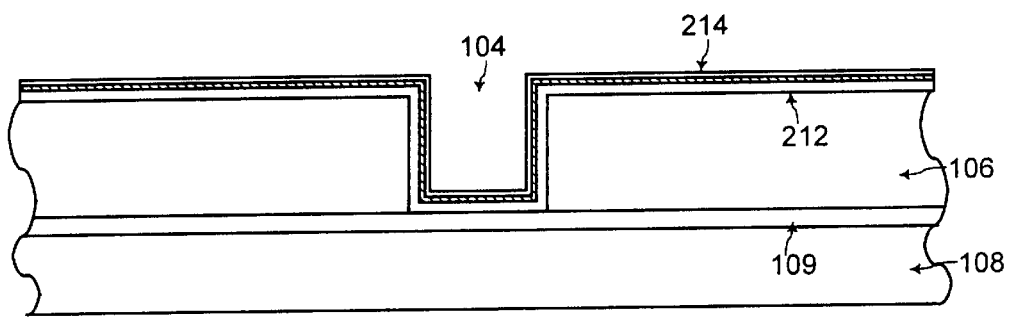
Figure 13:
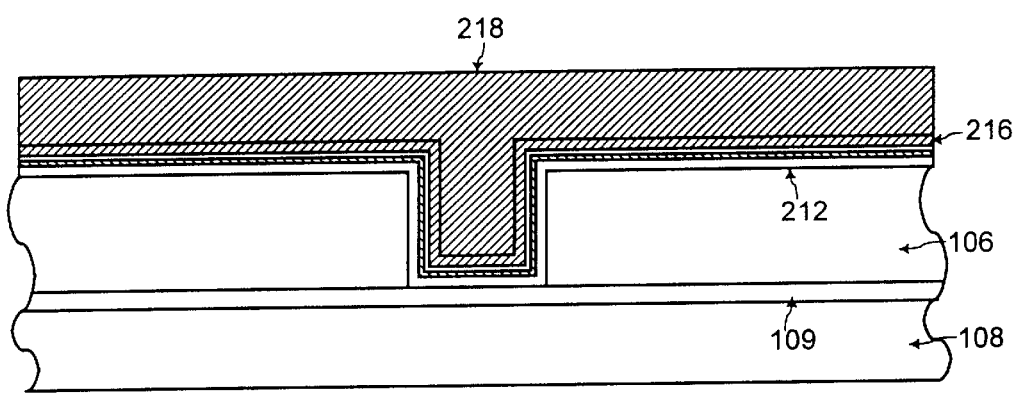

Referring to FIGS. 11 and 12, the activation layer 214 of palladium is then formed on the layer of silicon rich material 220. Referring to FIG. 13, after formation of the activation layer 214 of palladium, the copper seed layer 216 and the copper conductive fill 218 are formed as already described herein. When the activation layer 214 of palladium is formed on the layer of silicon rich material 220, the palladium of the activation layer 214 has even higher nuclei density and uniformity because in that case the palladium of the activation layer 214 is formed by a palladium and silicon displacement reaction. In such a displacement reaction, a silicon atom from the layer of silicon rich material 220 is displaced and replaced by a palladium atom to form the activation layer 214. Displacement reactions are generally known to one of ordinary skill in the art of integrated circuit fabrication. The palladium of the activation layer 214 formed with such a displacement reaction has higher nuclei density and uniformity.

Referring to FIGS. 5, 11, and 12, when the layer of silicon rich material 220 is formed, the ratio of the tin ion concentration to the palladium ion concentration within the activation bath 206 may be decreased than when the layer of silicon rich material 220 is not formed for the palladium of the activation layer 214 still having high nuclei density and uniformity. In addition, the ratio of the tin ion concentration to the palladium ion concentration within the activation bath 206 may be decreased with an increase in the amount of silicon atoms of the layer of silicon rich material 220.

For example, when the layer of silicon rich material 220 is formed to be comprised of a majority of silicon, the ratio of the tin ion concentration to the palladium ion concentration in the activation bath may be one of 3:1 or 5:2 (instead of 5:1 when the layer of silicon rich material 220 is not formed). Or, when the layer of silicon rich material 220 is formed to be comprised of substantially only silicon atoms, the ratio of the tin ion concentration to the palladium ion concentration in the activation bath may be further decreased to 2:1.

In this manner, the activation layer 214 of palladium is formed with higher nuclei density and uniformity to prevent agglomeration of the activation layer 214 as the thickness of the activation layer 214 is scaled down to tens of angstroms. Such a uniform activation layer 214 in turn results in uniform deposition of the copper seed layer 216 which prevents formation of voids within the copper interconnect for minimizing electromigration failure of the copper interconnect. In addition, the thinner activation layer 214 advantageously results in minimized resistance of the copper interconnect.

Figure 14:
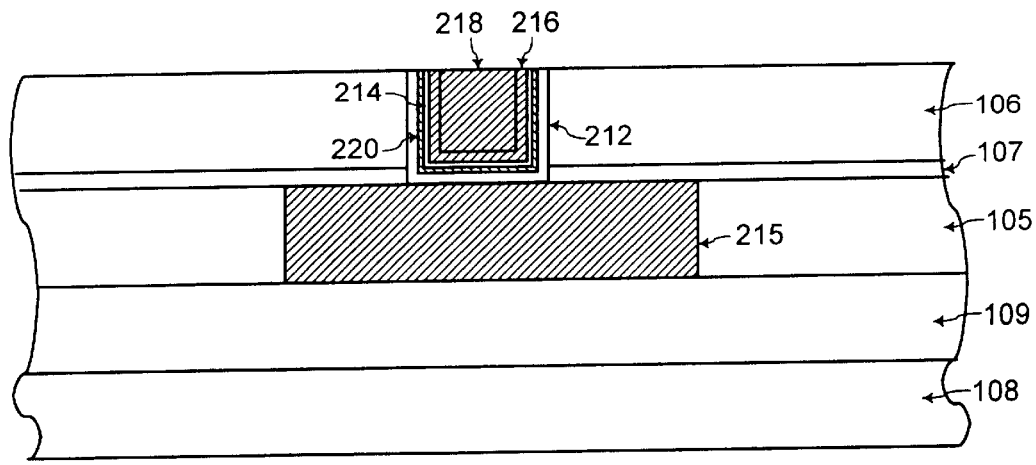
FIG. 14 shows a cross-sectional view illustrating formation of the interconnect structure formed with the system of FIG. 5 for a thin palladium activation layer having high nuclei density and uniformity when the interconnect opening is a via hole, according to another embodiment of the present invention.

In FIGS. 10 and 13, the interconnect opening 104 is a trench for a metal line. In another embodiment of the present invention, the interconnect structure of the present invention is formed within an interconnect opening that is a via hole formed over a conductive interconnect structure. Referring to FIG. 14, the interconnect opening is a via hole formed over a conductive interconnect structure 215. The conductive interconnect structure 215 is formed within another layer of dielectric material 105 capped by a hardmask layer 107 and is formed on the dielectric layer 109.

Figure 15:
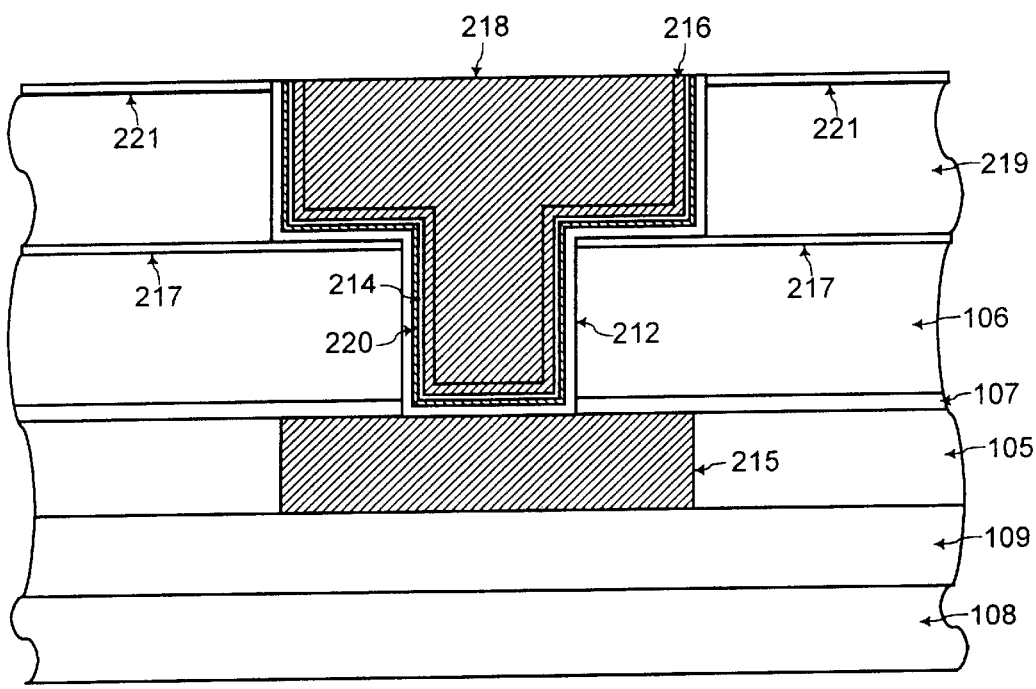
FIG. 15 shows a cross-sectional view illustrating formation of the interconnect structure formed with the system of FIG. 5 for a thin palladium activation layer having high nuclei density and uniformity when the interconnect opening is a dual damascene opening, according to another embodiment of the present invention.

Referring to FIG. 15, the interconnect structure of the present invention is formed within an interconnect opening that is a dual damascene opening formed over the conductive interconnect structure 215. In the dual damascene opening of FIG. 15, both a lower opening is formed within the bottom insulating layer 106 with a hardmask layer 217 for forming a via plug to the conductive interconnect structure 215, and an upper opening is formed in an upper insulating layer 219. An additional hardmask layer 221 is formed on the top surface of the upper insulating layer 219 surrounding the interconnect opening. The upper opening formed in the upper insulating layer 219 is for an upper conductive interconnect structure. With the dual damascene opening of FIG. 15, the via structure and the upper conductive interconnect structure are formed substantially simultaneously on the lower conductive interconnect structure 215.

Such a dual damascene opening and such a via hole are known to one of ordinary skill in the art of integrated circuit fabrication. For the via hole of FIG. 14 or the dual damascene opening of FIG. 15, the diffusion barrier material 214, the layer of silicon rich material 220, the activation layer of palladium 214, the copper seed layer 216, and the copper conductive fill material 218 are formed as already described herein.

The foregoing is by way of example only and is not intended to be limiting. For example, the present invention is described for formation of copper interconnect. However, the present invention may be practiced for minimizing electromigration failure and resistance with conductive fill of other types of interconnects, as would be apparent to one of ordinary skill in the art of integrated circuit fabrication from the description herein. In addition, formation of a metal line, a via hole, and a dual damascene opening are illustrated. However, the present invention may be practiced with other types of interconnect openings, as would be apparent to one of ordinary skill in the art of integrated circuit fabrication from the description herein. More specifically, the present invention may be practiced with the metal line, the via hole, and the dual damascene opening formed with different layers of material surrounding such openings, as would be apparent to one of ordinary skill in the art of integrated circuit fabrication from the description herein.

Additionally, as will be understood by those skilled in the art, the structures described herein may be made or used in the same way regardless of their position and orientation. Accordingly, it is to be understood that terms and phrases such as "on," "top," "bottom," and "side" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. A system for fabricating an interconnect structure within an interconnect opening surrounded by dielectric material, the system comprising:

a barrier material deposition unit for forming a layer of diffusion barrier material on at least one wall of said interconnect opening;

an activation bath comprised of tin ions and palladium ions for forming an activation layer comprised of palladium on said layer of diffusion barrier material when said interconnect opening is immersed within said activation bath;

wherein said tin ions have a tin ion concentration in said activation bath that is greater than a palladium ion concentration in said activation bath;

a seed layer deposition unit for forming a layer of seed material on said activation layer in an electroless deposition process; and a conductive fill deposition unit for growing a conductive fill material from said layer of seed material for filling said interconnect opening.

2. The system of claim 1, wherein a layer of silicon rich material is formed on said layer of diffusion barrier material before formation of said activation layer such that said activation layer is formed on said layer of silicon rich material, wherein a ratio of said tin ion concentration to said palladium ion concentration in said activation bath is adjusted to decrease with an amount of silicon atoms of said layer of silicon rich material deposited on said diffusion barrier material.

3. The system of claim 2, wherein when said layer of silicon rich material is not deposited on said layer of diffusion barrier material, said ratio of said tin ion concentration to said palladium ion concentration is 5:1.

4. The system of claim 2, wherein when said layer of silicon rich material is deposited on said layer of diffusion barrier material, said ratio of said tin ion concentration to said palladium ion concentration in said activation bath is one of 3:1 or 5:2.

5. The system of claim 2, wherein when said layer of silicon rich material that is comprised of substantially only silicon atoms is deposited on said diffusion barrier material, said ratio of said tin ion concentration to said palladium ion concentration in said activation bath is 2:1.

6. The system of claim 1, wherein said layer of seed material and said conductive fill material are comprised of copper.

7. The system of claim 6, wherein said layer of diffusion barrier material is comprised of titanium silicon nitride (TiSiN).

8. The system of claim 1, wherein said interconnect opening is one of a metal line, a via hole, or a dual damascene opening.

9. An interconnect structure formed within an interconnect opening surrounded by dielectric material, the interconnect structure comprising:

a layer of diffusion barrier material deposited on at least one wall of said interconnect opening;

a layer of silicon rich material formed on said layer of diffusion barrier material;

an activation layer comprised of palladium formed on said layer of silicon rich material;

a layer of seed material formed on said activation layer in an electroless deposition process; and a conductive fill material grown from said layer of seed material for filling said interconnect opening.

10. The interconnect structure of claim 9, wherein said layer of seed material and said conductive fill material are comprised of copper.

11. The interconnect structure of claim 10, wherein said layer of diffusion barrier material is comprised of titanium silicon nitride (TiSiN).

12. The interconnect structure of claim 9, wherein said interconnect opening is one of a metal line, a via hole, or a dual damascene opening.

13. A system for fabricating an interconnect structure within an interconnect opening, the system comprising:

an activation bath comprised of tin ions and palladium ions for forming an activation layer comprised of palladium on an underlying material within said interconnect opening when said interconnect opening is immersed within said activation bath;

wherein said tin ions have a tin ion concentration in said activation bath that is greater than a palladium ion concentration in said activation bath; and a conductive fill deposition unit for forming a conductive fill material for filling said interconnect opening after formation of said activation layer.

14. The system of claim 13, wherein a layer of silicon rich material is formed on said underlying material before formation of said activation layer such that said activation layer is formed on said layer of silicon rich material, and wherein a ratio of said tin ion concentration to said palladium ion concentration in said activation bath is adjusted to decrease with an amount of silicon atoms of said layer of silicon rich material.

15. The system of claim 14, wherein when said layer of silicon rich material is not deposited on said underlying material, said ratio of said tin ion concentration to said palladium ion concentration is 5:1.

16. The system of claim 14, wherein when said layer of silicon rich material is deposited on said underlying material, said ratio of said tin ion concentration to said palladium ion concentration in said activation bath is one of 3:1 or 5:2.

17. The system of claim 14, wherein when said layer of silicon rich material that is comprised of substantially only silicon atoms is deposited on said underlying material, said ratio of said tin ion concentration to said palladium ion concentration in said activation bath is 2:1.

18. The system of claim 13, wherein said conductive fill material is comprised of copper.

19. The system of claim 13, wherein said interconnect opening is one of a metal line, a via hole, or a dual damascene opening.

* * * * *